US012777786B2

(12) United States Patent
Zhou et al.

(10) Patent No.: US 12,777,786 B2
(45) Date of Patent: Oct. 27, 2026

(54) DRIVING CIRCUIT AND DISPLAY PANEL INCLUDING DISPLAY REGION FAN-OUT LINES

(71) Applicant: Wuhan China Star Optoelectronics Semiconductor Display Technology Co., Ltd., Wuhan (CN)

(72) Inventors: Kun Zhou, Wuhan (CN); Shaojing Wu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 1155 days.

(21) Appl. No.: 17/790,233

(22) PCT Filed: Jun. 29, 2022

(86) PCT No.: PCT/CN2022/102222
§ 371 (c)(1),
(2) Date: Jun. 30, 2022

(87) PCT Pub. No.: WO2023/231115
PCT Pub. Date: Dec. 7, 2023

(65) Prior Publication Data

US 2024/0179970 A1 May 30, 2024

(30) Foreign Application Priority Data

May 31, 2022 (CN) ........................ 202210612377.7

(51) Int. Cl.
*H10K 59/13* (2023.01)
*H10K 59/131* (2023.01)

(52) U.S. Cl.
CPC ................................. *H10K 59/131* (2023.02)

(58) Field of Classification Search
CPC ... G09G 3/3208; G09G 3/3225; H10K 59/131
See application file for complete search history.

(56) References Cited

U.S. PATENT DOCUMENTS 10,367,052 B2 7/2019 Zhang et al.
2012/0098811 A1* 4/2012 Park ................. G02F 1/136286 345/211

(Continued)

FOREIGN PATENT DOCUMENTS

CN 103578418 B * 8/2016 ......... G02F 1/13452
CN 108598139 9/2018

(Continued)

OTHER PUBLICATIONS

Notification of Office Action and Search Report Dated Sep. 20, 2024 From The State Intellectual Property Office of the People's Republic of China Re. Application No. 202210612377.7 and Its Translation Into English. (18 Pages).

(Continued)

*Primary Examiner* — Ida M Soward

(57) ABSTRACT

A driving circuit and a display panel are provided. The driving circuit at least includes first fan-out lines, second fan-out lines, and data lines. The first fan-out lines are located in the display region and electrically connected to the driving chip. The second fan-out lines are located in the display region and connected to the first fan-out lines. The data lines are located in the display region and connected to the second fan-out lines. Wherein, the first fan-out lines, the second fan-out lines, and the data lines are located in different layers, and the second fan-out lines are located between the first fan-out lines and the data lines.

20 Claims, 5 Drawing Sheets

(56) References Cited

U.S. PATENT DOCUMENTS

| | | | | |
|---|---|---|---|---|
| 2014/0146257 | A1* | 5/2014 | Fujikawa | G02F 1/1345<br>349/42 |
| 2016/0358939 | A1* | 12/2016 | Lee | H10D 86/441 |
| 2016/0377904 | A1* | 12/2016 | Shin | G02F 1/13452<br>257/776 |
| 2019/0278145 | A1* | 9/2019 | Tanaka | G02F 1/136286 |
| 2020/0090559 | A1* | 3/2020 | Song | G02F 1/1345 |
| 2020/0363688 | A1* | 11/2020 | Shih | G02F 1/136286 |
| 2021/0028261 | A1* | 1/2021 | Lee | H10K 59/126 |

FOREIGN PATENT DOCUMENTS

| | | | | | |
|---|---|---|---|---|---|
| CN | 109791745 | | | 5/2019 | |
| CN | 111933674 | | | 11/2020 | |
| CN | 113451380 | | | 9/2021 | |
| CN | 114171574 | | | 3/2022 | |
| CN | 114220834 | | | 3/2022 | |
| CN | 114497151 | | | 5/2022 | |
| CN | 114497151 | A | * | 5/2022 | H10K 59/131 |
| KR | 20140053626 | A | * | 5/2014 | G09F 9/301 |
| WO | WO-2014112560 | A1 | * | 7/2014 | G02F 1/136286 |
| WO | WO 2022/089071 | | | 5/2022 | |

OTHER PUBLICATIONS

International Search Report and the Written Opinion Dated Dec. 22, 2022 From the International Searching Authority Re. Application No. PCT/CN2022/102222 and Its Translation Into English. (16 Pages).

* cited by examiner

200

DRIVING CIRCUIT AND DISPLAY PANEL INCLUDING DISPLAY REGION FAN-OUT LINES

RELATED APPLICATIONS

This application is a National Phase of PCT Patent Application No. PCT/CN2022/102222 having International filing date of Jun. 29, 2022, which claims the benefit of priority of Chinese Patent Application No. 202210612377.7 filed on May 31, 2022. The contents of the above applications are all incorporated by reference as if fully set forth herein in their entirety.

FIELD AND BACKGROUND OF THE INVENTION

The present application relates to the field of display technology, and particularly relates to a driving circuit and a display panel.

Active matrix organic light-emitting Diode (AMOLED) display panels have gradually become a new generation of display technology due to their high contrast ratio, wide color gamut, and low power consumption. Compared to traditional liquid crystal display (LCD) panels, organic light emitting diode (OLED) display panels are easy to be flexible, which is a key technology for wearable and foldable products.

With development of OLED panel technology, narrow bezel technology becomes a differentiated technology to attract users. Currently, how to realize lower narrow bezels is an urgent problem to be solved.

SUMMARY OF THE INVENTION

One purpose of the present application is to provide a driving circuit and a display panel to aim at realizing a lower narrow bezel.

On one aspect, the present application provides a driving circuit. The driving circuit includes a display region and a driving chip located out of the display region. The driving circuit at least includes:

- first fan-out lines located in the display region and electrically connected to the driving chip;
- second fan-out lines located in the display region and connected to the first fan-out lines; and
- data lines located in the display region and connected to the second fan-out lines,
- wherein the first fan-out lines, the second fan-out lines, and the data lines are located in different layers, and the second fan-out lines are located between the first fan-out lines and the data lines.

In some embodiments, the second fan-out lines are connected to the first fan-out lines through first via holes, and the data lines are connected to the second fan-out lines through second via holes.

In some embodiments, the first fan-out lines are disposed from a bottom section of the display region along a first direction, the second fan-out lines are bent relative to the first fan-out lines, and the first via holes are located at bending positions of the second fan-out lines and the first fan-out lines.

In some embodiments, the data lines continuously extend along the first direction, the second via holes are located at intersection positions of the data lines and the second fan-out lines, and one of the second fan-out lines is connected to one of the data lines.

In some embodiments, the first fan-out lines include first fan-out sub-lines and second fan-out sub-lines being symmetrical along the first direction, the second fan-out lines include third fan-out sub-lines and fourth fan-out sub-lines being symmetrical along the first direction, a length of the first fan-out sub-lines gradually reduces along a second direction facing away from the second fan-out sub-lines, a length of the second fan-out sub-lines gradually reduces along a third direction facing away from the first fan-out sub-lines, the third fan-out sub-lines are bent toward the second direction, and the fourth fan-out sub-lines are bent toward the third direction.

In some embodiments, the driving circuit further includes:

- first power supply signal lines located in the display region, disposed with the first fan-out lines in a same layer, and disconnected from the first fan-out lines; wherein the first power supply signal lines extend from the first via holes along a direction facing away from the bottom section of the display region; and
- second power supply signal lines located in the display region, disposed with the second fan-out lines in a same layer, and disconnected from the second fan-out lines; wherein the second power supply signal lines extend between the third fan-out sub-lines and the fourth fan-out sub-lines.

In some embodiments, the driving circuit further includes:

- third power supply signal lines located in the display region, disposed with the first fan-out lines in the same layer, and continuously extending along the first direction; and
- fourth power supply signal lines located in the display region, disposed with the data lines in a same layer, and continuously extending along the first direction.

In some embodiments, the first power supply signal lines are connected to the fourth power supply signal lines through third via holes, the second power supply signal lines are connected to the fourth power supply signal lines through fourth via holes, and the third power supply signal lines are connected to the fourth power supply signal lines through fifth via holes.

In some embodiments, the display region comprises a plurality of pixels, each of the pixels corresponds to three of the first fan-out lines and one of the third power supply signal lines; each of the pixels includes two sub-pixels, one of the sub-pixels corresponds to two of the first fan-out lines, another one of the sub-pixels corresponds to a residual one of the first fan-out lines and one of the third power supply signal lines.

On another aspect, the present application provides a display panel. The display panel at least includes the driving circuit of any aforesaid embodiment.

A driving circuit and a display panel are provided. The driving circuit includes a display region and a driving chip located out of the display region. The driving circuit at least includes first fan-out lines, second fan-out lines, and data lines. The first fan-out lines are located in the display region and electrically connected to the driving chip. The second fan-out lines are located in the display region and connected to the first fan-out lines. The data lines are located in the display region and connected to the second fan-out lines. Wherein, the first fan-out lines, the second fan-out lines, and the data lines are located in different layers, and the second fan-out lines are located between the first fan-out lines and the data lines. By disposing two layers of fan-out lines located in a layer on the data lines in the display region, driving for the data lines by the driving chip can be realized. Because the first fan-out lines and the second fan-out lines are both located in the display region, a space that originally required wiring under the display region can be saved to realize the lower narrow bezel.

BRIEF DESCRIPTION OF THE SEVERAL VIEWS OF THE DRAWINGS

The technical solutions and other advantageous effects of the present application will be apparent with reference to the following accompanying drawings and detailed description of embodiments of the present application.

DESCRIPTION OF SPECIFIC EMBODIMENTS OF THE INVENTION

Figure 1:
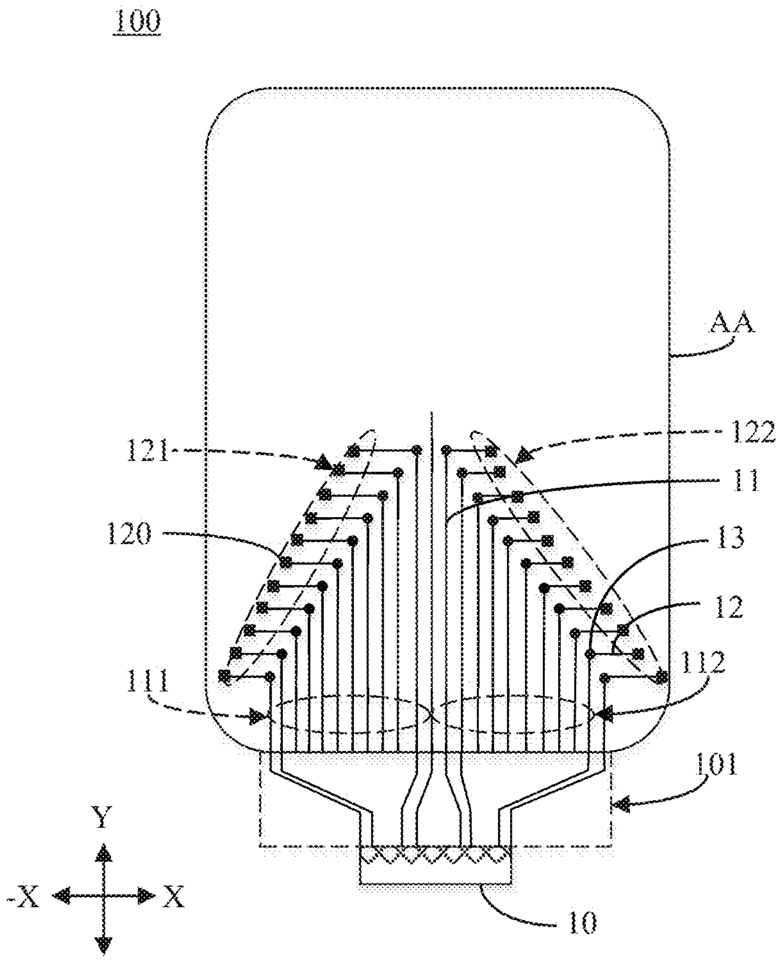
FIG. 1 is a structural schematic diagram of a driving circuit provided by one embodiment of the present application.

The technical solutions in the embodiments of the present disclosure are clearly and completely described in the following with reference to the accompanying drawings in the embodiments of the present disclosure. Obviously, the described embodiments are only part of the embodiments of the present application, but are not all embodiments of the present application. All other embodiments obtained by those skilled in the art based on the embodiments of the present application without creative efforts are within the scope of the present application.

In the description of the present application, terms “first” and “second” are used for descriptive purposes only and are not to be understood as indicating or implying relative importance or implicitly indicating the number of the indicated technical characteristics. Therefore, the characteristics defined by “first” or “second” may include one or more of the described characteristics either explicitly or implicitly. In the description of the present application, the meaning of “a plurality” is two or more unless clearly and specifically defined otherwise.

In the present application, unless expressly specified or limited otherwise, a first feature is “on” or “beneath” a second feature may include that the first feature directly contacts the second feature and may also include that the first feature does not directly contact the second feature. Furthermore, a first feature “on,” “above,” or “on top of” a second feature may include an embodiment in which the first feature is right “on,” “above,” or “on top of” the second feature and may also include that the first feature is not right “on,” “above,” or “on top of” the second feature, or just means that the first feature has a sea level elevation higher than the sea level elevation of the second feature. While first feature “beneath,” “below,” or “on bottom of” a second feature may include that the first feature is “beneath,” “below,” or “on bottom of” the second feature and may also include that the first feature is not right “beneath,” “below,” or “on bottom of” the second feature, or just means that the first feature has a sea level elevation lower than the sea level elevation of the second feature.

The following disclosure provides many different embodiments or examples for implementing the different structures of the present disclosure. In order to simplify the disclosure of the present application, the assemblies and configurations of the specific examples are described below. Of course, they are merely examples and are not intended to limit the present application. In addition, the present application may repeat reference numerals and/or reference numerals in different examples, which are for the purpose of simplicity and clarity, and do not indicate the relationship between the various embodiments and/or arrangements discussed. Moreover, the present application provides embodiments of various specific processes and materials, but one of ordinary skill in the art will recognize the use of other processes and/or the use of other materials.

Please refer to FIG. 1. FIG. 1 is a structural schematic diagram of a driving circuit provided by one embodiment of the present application. The driving circuit 100 can be applied in various display devices or display panels, e.g., liquid crystal displays (LCDs), organic light-emitting diode (OLED) displays, and micro light-emitting diode (Micro-LED) displays, etc.

Figure 6:
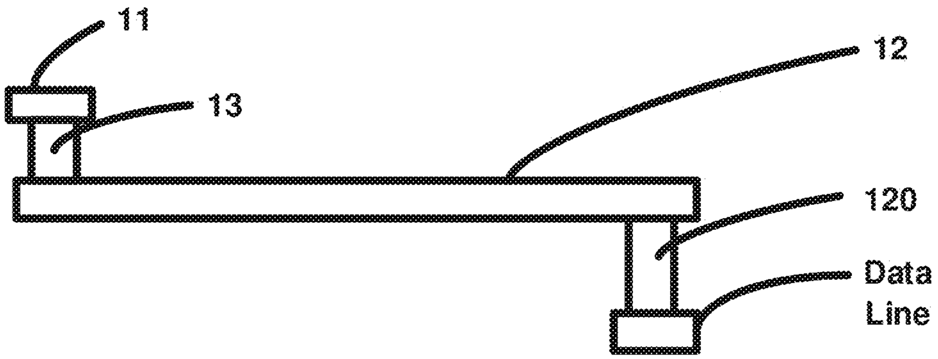
FIG. 6 is a schematic cross-sectional diagram showing a driving circuit provided by one embodiment of the present application.

The driving circuit 100 includes a display region AA and a driving chip 10 located out of the display region AA, i.e., the driving chip 10 is located in a non-display region. The driving circuit 100 at least includes first fan-out lines 11, second fan-out lines 12, and data lines (not shown in FIG. 1). The first fan-out lines 11 are located in the display region AA and electrically connected to the driving chip 10. The second fan-out lines 12 are located in the display region AA and connected to the first fan-out lines 11. The data lines are located in the display region AA and connected to the second fan-out lines 12. Wherein, the first fan-out lines 11, the second fan-out lines 12, and the data lines are located in different layers, and the second fan-out lines 12 are located between the first fan-out lines 11 and the data lines. By disposing the second fan-out lines 12 in a layer on the data lines and the first fan-out lines 11 in a layer on the second fan-out lines 12 in the display region AA as shown in FIG. 6, the second fan-out lines 12 are connected to the first fan-out lines 11 through connection of the data lines to realize electrical connection. Therefore, driving the data lines by the driving chip 10 is allowed to realize.

In some embodiments, the driving chip 10 can be located under the display region AA, and each of the first fan-out lines 11 is connected to one channel of the driving chip 10. The driving circuit 100 can further include third fan-out lines 101 located between the driving chip 10 and the display region AA, i.e., the third fan-out lines 101 are located in the non-display region. The first fan-out lines 11 can be connected to the driving chip 10 through the third fan-out lines 101. It should be noted that only few third fan-out lines 101 are illustrated in FIG. 1, but actually, each of the first fan-out lines 11 is connected to the driving chip 10 through one third fan-out line 101.

Figure 3:
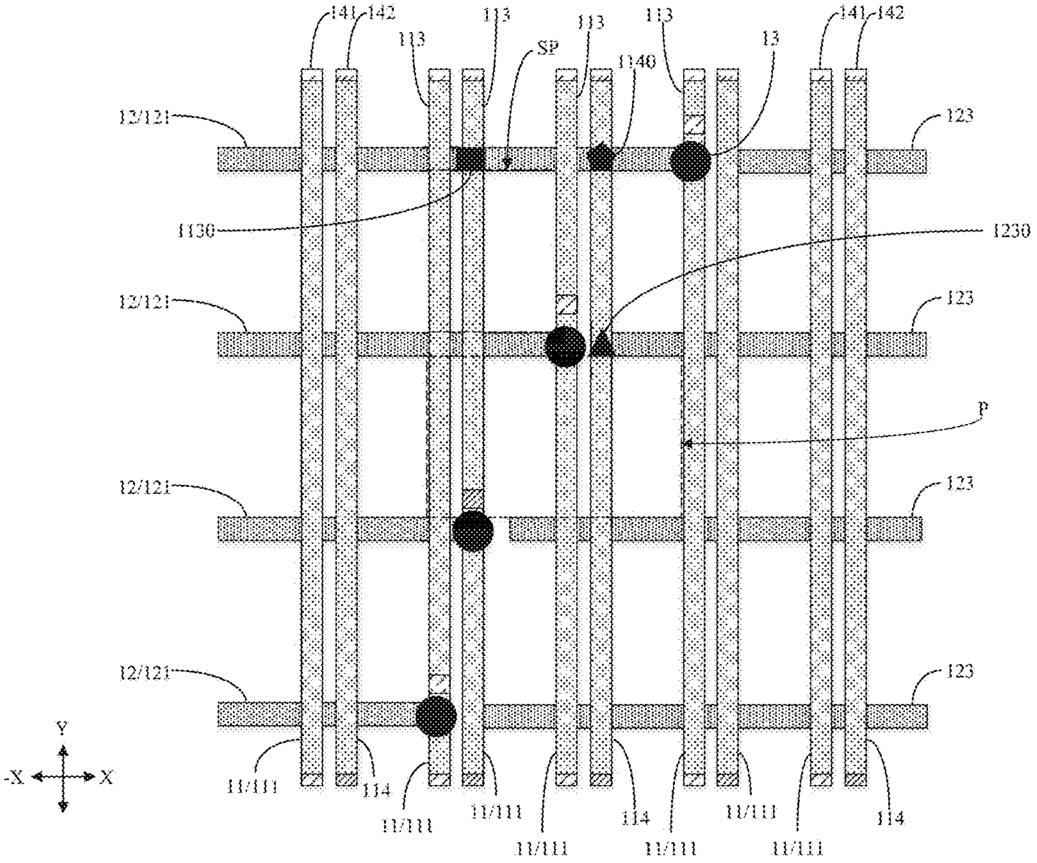
FIG. 3 is a schematic diagram of line distribution of a region C in FIG. 2 provided by one embodiment of the present application.

In some embodiments, the second fan-out lines 12 are connected to the first fan-out lines 11 through first via holes 13, and the data lines are connected to the second fan-out lines 12 through second via holes 120. It should be noted that FIG. 1 mainly shows a wiring method and connection relation between the first fan-out lines 11 and the second fan-out lines 12. Therefore, for a clearer display, the data lines located in a layer under the second fan-out lines 12 are not shown. The data lines will be described below and is illustrated in FIG. 3.

In one embodiment, as illustrated in FIG. 1, the first fan-out lines 11 extend from a bottom section of the display region AA toward interior of the display region AA along a first direction (Y), the second fan-out lines 12 are bent relative to the first fan-out lines 11, and the first via holes 13 are located at bending positions of the second fan-out lines 12 and the first fan-out lines 11. Specifically, the first direction (Y) can be parallel to a length direction of the display region AA, a bending direction of the second fan-out lines 12 relative to the first fan-out lines 11 can be perpendicular to the first direction (Y), i.e., the bending direction of the second fan-out lines 12 can be parallel to a width direction of the display region AA.

Wherein, the first fan-out lines 11 can include first fan-out sub-lines 111 and second fan-out sub-lines 112 being symmetrical along the first direction (Y), and the second fan-out lines 12 include third fan-out sub-lines 121 and fourth fan-out sub-lines 122 being symmetrical along the first direction (Y). The third fan-out sub-lines 121 are bent perpendicularly relative to the first fan-out sub-lines 111, and connections of the third fan-out sub-lines 121 and the first fan-out sub-lines 111 are realized at bending positions through the first via holes 13. The fourth fan-out sub-lines 122 are bent perpendicularly relative to the second fan-out sub-lines 112, and connections of the fourth fan-out sub-lines 122 and the second fan-out sub-lines 112 are realized at bending positions through the first via holes 13. Specifically, the third fan-out sub-lines 121 are bent toward a second direction (−X), and the fourth fan-out sub-lines 122 are bent toward a third direction (X). The second direction (−X) and the third direction (X) are two opposite directions perpendicular to the first direction (Y). As the first fan-out lines 11 and the second fan-out lines 12 are symmetrical along the first direction (Y), the second direction (−X) can also be referred to as a direction of the first fan-out sub-lines 111 facing away from the second fan-out sub-lines 112, the third direction (X) can also be referred to as a direction of the second fan-out sub-lines 112 facing away from the first fan-out sub-lines 111.

In some embodiments, a length of the plurality of first fan-out sub-lines 111 gradually reduces along the second direction (−X), and a length of the plurality of second fan-out sub-lines 112 gradually reduces along the third direction (X). The first via holes 13 are located at end sections of the first fan-out lines 11 (different from the end located at the bottom section of the display region AA). Therefore, the first via holes 13 connected to the third fan-out sub-lines 121 and the first sub-lines 111 are substantially arranged in an oblique line, and the first via holes 13 connected to the fourth fan-out sub-lines 122 and the second fan-out sub-lines 112 are substantially arranged in an oblique line.

In some embodiments, the data lines continuously extend along the first direction (Y) and intersects with the second fan-out lines 12. The second via holes 120 are located at intersection positions of the data lines and the second fan-out lines 12, and one of the second fan-out lines 12 is connected to one of the data lines.

Specifically, the third fan-out sub-lines 121 include first ends and second ends, and the fourth fan-out sub-lines 122 include third ends and fourth ends. The first ends are connected to the end sections of the first fan-out sub-lines 111 (different from the end located at the bottom section of the display region AA). The third ends are connected to the end sections of the second fan-out sub-lines 112 (different from the end located at the bottom section of the display region AA). The second ends are also intersection positions of the third fan-out sub-lines 121 and the data lines, and the fourth ends are also intersection positions of the fourth fan-out sub-lines 122 and the data lines. Therefore, the second via holes 120 are located at the second ends and the fourth ends to realize connection of the second fan-out lines 12 and the data lines.

In some embodiments, lengths of the plurality of third fan-out sub-lines 121 can be substantially equal, and lengths of the plurality of fourth fan-out sub-lines 122 can also be substantially equal. Therefore, the second via holes 120 connected to the third fan-out sub-lines 121 and the data lines are substantially arranged in an oblique line, and the second via holes 120 connected to the fourth fan-out sub-lines 122 and the data lines are substantially arranged in an oblique line.

Figure 2:
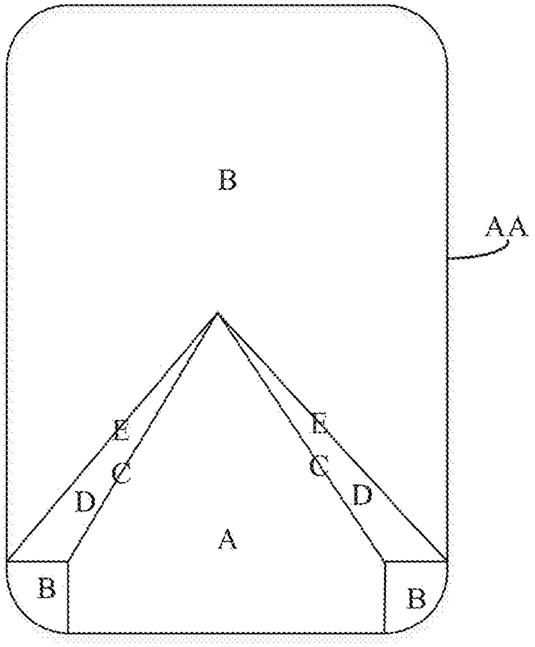
FIG. 2 is a schematic diagram of a region division of a display region provided by one embodiment of the present application.

Please combine with FIG. 2. FIG. 2 is a schematic diagram of a region division of the display region AA provided by one embodiment of the present application. The display region AA can be divided into a plurality of regions, e.g., a region A, a region B, a region C, a region D, and a region E. Combined illustrated in FIG. 1, the first fan-out lines 11 are distributed in the region A, the second fan-out lines 12 are distributed in the region D, the first via holes 13 are distributed in the region C, and the second via holes 120 are distributed in the region E. The region B is a region where no fan-out line exists. It can be understood that the first via holes 13 are arranged in an oblique line along the region C, and the second via holes 120 are arranged in an oblique line along the region E.

Please combine with FIG. 3. FIG. 3 is a schematic diagram of line distribution of the region C in FIG. 2 provided by one embodiment of the present application. Precisely, FIG. 3 shows the region C on a left side of FIG. 2, and FIG. 3 further shows the line distribution of a part of the region A and a part of the region D on two sides of the region C. As illustrated in FIG. 3, in fact, the first via holes 13 are not completely arranged in the straight oblique line as illustrated in FIG. 2. The region C in FIG. 2 just exemplarily shows a approximate arrangement of the first via holes 13.

In this embodiment, positions of the data lines 141 overlap with positions of the first fan-out lines 11, but the data lines 141 extend in the first direction (Y), and the length of the first fan-out lines 11 changes gradually. The first fan-out lines 11 illustrated in FIG. 3 are the first fan-out sub-lines 111, and the lengths of the plurality of first fan-out sub-lines 111 along the second direction (−X) gradually reduce. Wherein, the data lines 141 are located at a bottom layer, the second fan-out lines 12 are located in a middle layer, and the first fan-out lines 11 are located in a top layer.

In some embodiments, the driving circuit 100 can further include first power supply signal lines 113 and second power supply signals 123 located in the display AA. The first power supply signal lines 113 extend from the first via holes 13 along a direction facing away from the bottom section of the display region AA, and the first power supply signal lines 113 are disposed with the first fan-out lines 11 in a same layer and are disconnected from the first fan-out lines 11. That is, the first power supply signal lines 113 are located in an extension line of the first fan-out lines 11 and are disconnected from the first fan-out lines 11. The second power supply signal lines 123 extend between the third fan-out sub-lines 121 and the fourth fan-out sub-lines 122, and the second power supply signal lines 123 are disposed with the second fan-out lines 12 in a same layer and are disconnected from the second fan-out lines 12. That is, the second power supply signal lines 123 are located in an extension line of the second fan-out lines 12 and are disconnected from the second fan-out lines 12. The first power supply signal lines 113 and the second power supply signal lines 123 can increase uniformity of a density of wiring pattern.

It should be noted that the second fan-out lines 12 illustrated in FIG. 3 are the third fan-out sub-lines 121, and the fourth fan-out sub-lines 122 are not illustrated in FIG. 3.

In some embodiments, the driving circuit 100 further includes third power supply signal lines 114 located in the display region AA. The third power supply signal lines 114 are disposed with the first fan-out lines 11 in the same layer and continuously extend along the first direction (Y).

In some embodiments, the driving circuit 100 further includes fourth power supply signal lines 142 located in the display region AA. The fourth power supply signal lines 142 are disposed with the data lines 141 in a same layer and continuously extend along the first direction (Y).

Wherein, the first power supply signal lines 113 are connected to the fourth power supply signal lines 142 through third via holes 1130, the second power supply signal lines 123 are connected to the fourth power supply signal lines 142 through fourth via holes 1230, and the third power supply signal lines 114 are connected to the fourth power supply signal lines 142 through fifth via holes 1140. Positions of the third via holes 1130, the fourth via hole 1230, and the fourth via holes 1140 are not limited in the present application. The first power supply signal lines 113, the second power supply signal lines 123, and the third power supply signal lines 114 are respectively connected to the fourth power supply signal lines 142, which can prevent floating of the first power supply signal lines 113, the second power supply signal lines 123, and the third power supply signal lines 114, and can serve an anti-static effect.

In some embodiments, the display region AA can include a plurality of pixels P, and each of the pixels P includes two sub-pixels SP. Wherein, the data lines 141 and the fourth power supply signal lines 142 can arranged alternately, and each of the sub-pixels SP corresponds one data line 141 and one fourth power supply signal line 142. Correspondingly, one sub-pixel SP can correspond to two first fan-out lines 11, or can correspond to one first fan-out line 11 and one third power supply signal line 114. It can also be understood that each of the pixels P corresponds to three of the first fan-out lines 11 and one of the third power supply signal lines 114. In one pixel P, if one of the sub-pixels P corresponds to two first fan-out lines 11, then another one of the sub-pixels P corresponds to one residual first fan-out line 11 and one third power supply signal line 114.

Figure 4:
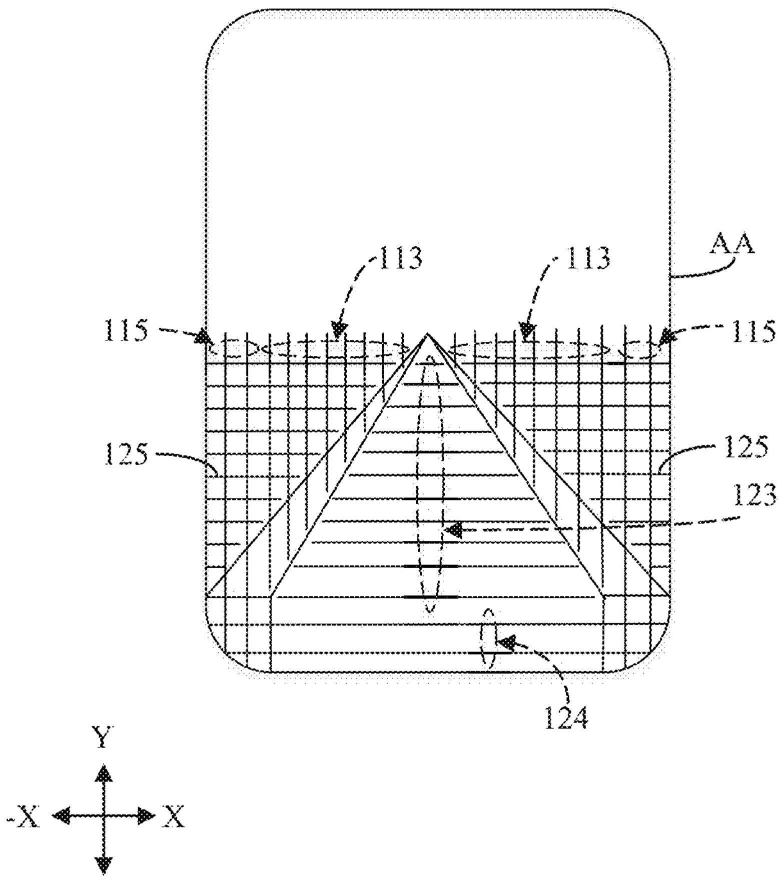
FIG. 4 is another structural schematic diagram of the driving circuit provided by one embodiment of the present application.

Please refer to FIG. 4. FIG. 4 is another structural schematic diagram of the driving circuit provided by one embodiment of the present application. FIG. 4 mainly shows the distribution of the power supply signal lines. Please combine with FIG. 1. It can be understood that the first power supply signal lines 113 are located in the extension line of the first fan-out lines 11 and are disconnected from the first fan-out lines 11. The second power supply signal lines 123 extend between the third fan-out sub-lines 121 and the fourth fan-out sub-lines 122, and the second power supply signal lines 123 are disposed with the second fan-out lines 12 (including the third fan-out lines 121 and the fourth fan-out lines 122) in the same layer and are disconnected from the second fan-out lines 12 (including the third fan-out lines 121 and the fourth fan-out lines 122).

In some embodiments, the driving circuit 100 can further include fifth power supply signal lines 115 and sixth power supply signals 124 located in the display region AA. The fifth power supply signal lines 115 are disposed with the first fan-out lines 11 in the same layer and are located on two sides of the first fan-out lines 11. The fifth power supply signal lines 115 continuously extend along the first direction (Y). The sixth power supply signal lines 124 are disposed with the second fan-out lines 12 in a same layer and are located on a side of the second power supply signal lines 123 close to the bottom section of the display region AA. The sixth power supply signal lines 124 continuously extend perpendicular to the first direction (Y). The fifth power supply signal lines 115 and the sixth power supply signal lines 124 can increase the uniformity of the density of the wiring pattern.

Wherein, the fifth power supply signal lines 115 and the sixth power supply signal lines 124 are connected to the fourth power supply signal lines 142 through via holes to prevent static electricity.

In some embodiments, the driving circuit 100 can further include seventh power supply signal lines 125 located in the display region AA. The seventh power supply signal lines 125 are disposed with the second fan-out lines 12 in the same layer and are disconnected from the second fan-out lines 12. Wherein, the seventh power supply signal lines 125, the second fan-out lines 12, and the second power supply signal lines 123 are distributed in an extension line and are disconnected from each other. Specifically, the seventh power supply signal lines 125 on the left side of FIG. 4 are located at an end of the third fan-out sub-lines 121 away from the second power supply signal lines 123, and the seventh power supply signal lines 125 on the right side of FIG. 4 are located at an end of the fourth fan-out sub-lines 122 away from the second power supply signal lines 123. The seventh power supply signal lines 125 can increase the uniformity of the density of the wiring pattern, and the seventh power supply signal lines 125 are connected to the fourth power supply signal lines 142 though via holes to prevent static electricity.

The driving circuit 100 provided by the embodiments of the present application includes the display region AA and the driving chip 10 located out of the display region AA. The driving circuit 100 at least includes the first fan-out lines 11, the second fan-out lines 12, and the data lines 141. The first fan-out lines 11 are located in the display region AA and electrically connected to the driving chip 10. The second fan-out lines 12 are located in the display region AA and connected to the first fan-out lines 11. The data lines 141 are located in the display region AA and connected to the second fan-out lines 12. Wherein, the first fan-out lines 11, the second fan-out lines 12, and the data lines 141 are located in different layers, and the second fan-out lines 12 are located between the first fan-out lines 11 and the data lines 141. By disposing two layers of fan-out lines located in a layer on the data lines 141 in the display region AA, driving for the data lines 141 by the driving chip 10 can be realized. Because the first fan-out lines 11 and the second fan-out lines 12 are both located in the display region AA, a space that originally required wiring under the display region AA can be saved to realize the lower narrow bezel.

Figure 5:
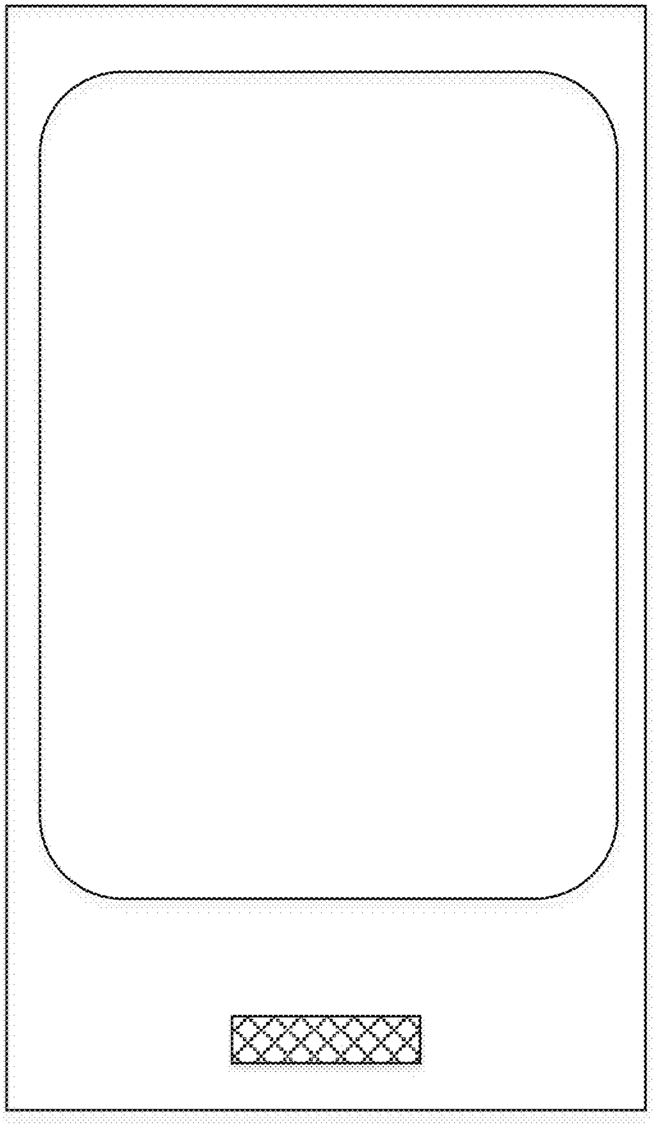
FIG. 5 is a structural schematic diagram of a display panel provided by one embodiment of the present application.

Please refer to FIG. 5. FIG. 5 is a structural schematic diagram of a display panel provided by one embodiment of the present application. The display panel 200 can include the driving circuit of any aforesaid embodiment. The driving circuit includes a display region and a driving chip located out of the display region. The driving circuit at least includes: first fan-out lines located in the display region and electrically connected to the driving chip; second fan-out lines located in the display region and connected to the first fan-out lines; and data lines located in the display region and connected to the second fan-out lines. Wherein, the first fan-out lines, the second fan-out lines, and the data lines are located in different layers, and the second fan-out lines are located between the first fan-out lines and the data lines.

The display panel 200 has the same beneficial effects as the driving circuit of any aforesaid embodiment, and redundant description will not be mentioned herein again.

The description of the embodiments mentioned above is only for helping to understand the technical solution and the core idea of the present application. It should be understood by those skilled in the art, that it can perform changes in the technical solution of the embodiments mentioned above, or can perform equivalent replacements in part of technical characteristics, and the changes or replacements do not make the essence of the corresponding technical solution depart from the scope of the technical solution of each embodiment of the present application.

What is claimed is:

1. A driving circuit, wherein the driving circuit comprises a display region and a driving chip located out of the display region, the driving circuit at least comprises:

first fan-out lines located in the display region and electrically connected to the driving chip;

second fan-out lines located in the display region and connected to the first fan-out lines; and data lines located in the display region and connected to the second fan-out lines through second via holes, and wherein the first fan-out lines, the second fan-out lines, and the data lines are located in different layers, the second fan-out lines are disposed in a layer over the data lines, and the first fan-out lines are disposed in a layer over the second fan-out lines.

2. The driving circuit as claimed in claim 1, wherein the second fan-out lines are connected to the first fan-out lines through first via holes.

3. The driving circuit as claimed in claim 2, wherein the first fan-out lines are disposed from a bottom section of the display region along a first direction, the second fan-out lines are bent relative to the first fan-out lines, and the first via holes are located at bending positions of the second fan-out lines and the first fan-out lines.

4. The driving circuit as claimed in claim 2, wherein the data lines continuously extend along the first direction, the second via holes are located at intersection positions of the data lines and the second fan-out lines, and one of the second fan-out lines is connected to one of the data lines.

5. The driving circuit as claimed in claim 3, wherein the first fan-out lines comprise first fan-out sub-lines and second fan-out sub-lines being symmetrical along the first direction, the second fan-out lines comprise third fan-out sub-lines and fourth fan-out sub-lines being symmetrical along the first direction, a length of the first fan-out sub-lines gradually reduces along a second direction facing away from the second fan-out sub-lines, a length of the second fan-out sub-lines gradually reduces along a third direction facing away from the first fan-out sub-lines, the third fan-out sub-lines are bent toward the second direction, and the fourth fan-out sub-lines are bent toward the third direction.

6. The driving circuit as claimed in claim 5, wherein the driving circuit comprises:

first power supply signal lines located in the display region, disposed with the first fan-out lines in a same layer, and disconnected from the first fan-out lines; wherein the first power supply signal lines extend from the first via holes along a direction facing away from the bottom section of the display region; and second power supply signal lines located in the display region, disposed with the second fan-out lines in a same layer, and disconnected from the second fan-out lines; wherein the second power supply signal lines extend between the third fan-out sub-lines and the fourth fan-out sub-lines.

7. The driving circuit as claimed in claim 6, wherein the driving circuit comprises:

third power supply signal lines located in the display region, disposed with the first fan-out lines in the same layer, and continuously extending along the first direction; and fourth power supply signal lines located in the display region, disposed with the data lines in a same layer, and continuously extending along the first direction.

8. The driving circuit as claimed in claim 7, wherein the first power supply signal lines are connected to the fourth power supply signal lines through third via holes, the second power supply signal lines are connected to the fourth power supply signal lines through fourth via holes, and the third power supply signal lines are connected to the fourth power supply signal lines through fifth via holes.

9. The driving circuit as claimed in claim 7, wherein the display region comprises a plurality of pixels, each of the pixels corresponds to three of the first fan-out lines and one of the third power supply signal lines; each of the pixels comprises two sub-pixels, one of the sub-pixels corresponds to two of the first fan-out lines, another one of the sub-pixels corresponds to a residual one of the first fan-out lines and one of the third power supply signal lines.

10. The driving circuit as claimed in claim 7, wherein the driving circuit comprises:

fifth power supply signal lines located in the display region, disposed with the first fan-out lines in the same layer, and located on two sides of the first fan-out lines; wherein the fifth power supply signal lines continuously extend along the first direction; and sixth power supply signal lines located in the display region, disposed with the second fan-out lines in a same layer, and located on a side of the second power supply signal lines close to the bottom section of the display region;

wherein the sixth power supply signal lines continuously extend perpendicular to the first direction; and wherein the fifth power supply signal lines and the sixth power supply signal lines are connected to the fourth power supply signal lines.

11. A display panel, wherein the display panel at least comprises the driving circuit as claimed in claim 1.

12. The display panel as claimed in claim 11, wherein the second fan-out lines are connected to the first fan-out lines through first via holes.

13. The display panel as claimed in claim 12, wherein the first fan-out lines are disposed from a bottom section of the display region along a first direction, the second fan-out lines are bent relative to the first fan-out lines, and the first via holes are located at bending positions of the second fan-out lines and the first fan-out lines.

14. The display panel as claimed in claim 12, wherein the data lines continuously extend along the first direction, the second via holes are located at intersection positions of the data lines and the second fan-out lines, and one of the second fan-out lines is connected to one of the data lines.

15. The display panel as claimed in claim 13, wherein the first fan-out lines comprise first fan-out sub-lines and second fan-out sub-lines being symmetrical along the first direction, the second fan-out lines comprise third fan-out sub-lines and fourth fan-out sub-lines being symmetrical along the first direction, a length of the first fan-out sub-lines gradually reduces along a second direction facing away from the second fan-out sub-lines, a length of the second fan-out sub-lines gradually reduces along a third direction facing away from the first fan-out sub-lines, the third fan-out sub-lines are bent toward the second direction, and the fourth fan-out sub-lines are bent toward the third direction.

16. The display panel as claimed in claim 15, wherein the driving circuit comprises:

first power supply signal lines located in the display region, disposed with the first fan-out lines in a same layer, and disconnected from the first fan-out lines; wherein the first power supply signal lines extend from the first via holes along a direction facing away from the bottom section of the display region; and second power supply signal lines located in the display region, disposed with the second fan-out lines in a same layer, and disconnected from the second fan-out lines; wherein the second power supply signal lines extend between the third fan-out sub-lines and the fourth fan-out sub-lines.

17. The display panel as claimed in claim 16, wherein the driving circuit comprises:

third power supply signal lines located in the display region, disposed with the first fan-out lines in the same layer, and continuously extending along the first direction; and fourth power supply signal lines located in the display region, disposed with the data lines in a same layer, and continuously extending along the first direction.

18. The display panel as claimed in claim 17, wherein the first power supply signal lines are connected to the fourth power supply signal lines through third via holes, the second power supply signal lines are connected to the fourth power supply signal lines through fourth via holes, and the third power supply signal lines are connected to the fourth power supply signal lines through fifth via holes.

19. The display panel as claimed in claim 17, wherein the display region comprises a plurality of pixels, each of the pixels corresponds to three of the first fan-out lines and one of the third power supply signal lines; each of the pixels comprises two sub-pixels, one of the sub-pixels corresponds to two of the first fan-out lines, another one of the sub-pixels corresponds to a residual one of the first fan-out lines and one of the third power supply signal lines.

20. The display panel as claimed in claim 17, wherein the driving circuit comprises:

fifth power supply signal lines located in the display region, disposed with the first fan-out lines in the same layer, and located on two sides of the first fan-out lines; wherein the fifth power supply signal lines continuously extend along the first direction; and sixth power supply signal lines located in the display region, disposed with the second fan-out lines in a same layer, and located on a side of the second power supply signal lines close to the bottom section of the display region; wherein the sixth power supply signal lines continuously extend perpendicular to the first direction; and wherein the fifth power supply signal lines and the sixth power supply signal lines are connected to the fourth power supply signal lines.

* * * * *